United States Patent [19]

Falckenberg

[11] B 4,000,977

[45] Jan. 4, 1977

[54] APPARATUS FOR PRODUCING MONOCRYSTALS BY THE VERNEUIL TECHNIQUE

[75] Inventor: Richard Falckenberg, Unterhaching, Germany

[73] Assignee: Siemens Aktiengesellschaft, Berlin & Munich, Germany

[22] Filed: Mar. 28, 1975

[21] Appl. No.: 563,165

[44] Published under the second Trial Voluntary Protest Program on March 9, 1976 as document No. B 563,165.

[30] Foreign Application Priority Data

Mar. 28, 1974 Germany .................. 2415110

[52] U.S. Cl. .................. 23/273 V; 156/615
[51] Int. Cl.² ...................... B01J 17/24
[58] Field of Search .......... 23/273 V; 156/609, 615

[56] References Cited

UNITED STATES PATENTS

| | | | |
|---|---|---|---|
| 2,792,287 | 5/1957 | Moore, Jr. et al. | 23/273 V |
| 3,012,374 | 12/1961 | Merker | 49/77 |
| 3,282,654 | 11/1966 | Hutcheson | 23/273 V |
| 3,876,382 | 4/1975 | Falckenberg | 23/273 V |

*Primary Examiner*—Norman Yudkoff
*Assistant Examiner*—Curtis P. Ribando
*Attorney, Agent, or Firm*—Hill, Gross, Simpson, Van Santen, Steadman, Chiara & Simpson

[57] ABSTRACT

An apparatus for producing monocrystals having a relatively large cross-section by the Verneuil technique wherein a seed crystal is mounted on a movable crystal support member within a furnace means having a burner guiding flame gases and crystal growth material for impingement against the seed crystal so that the material melts and adheres to the seed crystal and forms a monocrystal which grows axially upwardly therefrom while the seed crystal member is moved axially downwardly a distance corresponding to the amount of axial crystal growth so that substantially uniform growth conditions are maintained throughout the growing process. A relatively massive flame deflector member having a central passage therein is positioned within a furnace means in spaced registry from the burner and radially about the crystal support member so as to deflect the flame gases laterally away from the growing crystal and to receive sufficient heat therefrom to form a heat reservoir for the growing crystal after flame shutdown. At least one axially movable insert member is positioned within the through passage of the deflector member and radially spaced from the crystal support member and the deflector member so as to be selectively movable in relation to the deflector member and the support member.

5 Claims, 2 Drawing Figures

4,000,977

APPARATUS FOR PRODUCING MONOCRYSTALS BY THE VERNEUIL TECHNIQUE

CROSS-REFERENCE TO RELATED APPLICATIONS

Attention is directed to my U.S. Ser. No. 271,669, filed July 14, 1972 and allowed on Oct. 25, 1974, as well as to my earlier filed U.S. Ser. No. 124,125, filed on Mar. 15, 1971 (now abandoned); both of which disclosures are incorporated herein by reference.

BACKGROUND OF THE INVENTION

1. Field of the Invention

The invention relates to the production of monocrystals via the Verneuil technique and somewhat more particularly to an apparatus for producing relatively large diameter monocrystals while maintaining heatequilibrium conditions about the growing crystals during and after the growth process.

2. Prior Art

My above reference U.S. patent applications (which correspond to German DOS 2,014,203 and German DOS 2,057,782) generally disclose a novel arrangement for producing monocrystals via the Verneuil technique wherein a gas deflector unit is positioned within a suitable furnace so that the flame gases which impinge on the growing crystal are deflected away from the crystal in such a manner that the flame gases substantially only contact the dome or growth front of the crystal on which additional crystal forming material is melted and solidified during the process. In this type of arrangement, the flame or burner which produces the flame gas is positioned in vertical alignment above the crystal being grown so that the lateral deflection of the flame gases occur substantially directly below the upmost surface of the dome or growth front of the crystal. The flame gases flow laterally along the gas deflection unit and emerge from the furnace via a suitable gas outlet. The gas deflection unit within this type of arrangement is positioned within a heat-insulating member, which may form a part of the furnace encompassing the gas deflector unit. The gas deflector unit is of a relatively large mass and formed of a high heat capacity material in relation to the heat capacity of the crystal being grown, such as sintered aluminum oxide. This type of deflector unit thus absorbs a large amount of heat during the growth process and functions as a heat reservoir after the flame is shut off so that the grown crystal is not subjected to any sudden temperature variation. In other words, the grown crystal is in thermal equilibrium with such a gas deflector unit even after the flame has been terminated. Additional details of such arrangements may be obtained from the above referenced patents as well as from the following description of exemplary embodiments of the present invention.

DESCRIPTION OF THE PREFERRED EMBODIMENTS

Figure 2:
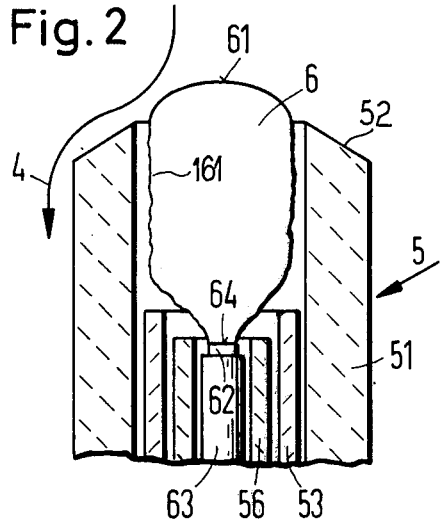
FIG. 2 is an enlarged schematic view illustrating the growth of a crystal within an apparatus of the invention.

In its more general aspects, the invention provides an apparatus for growing relatively large diameter crystals (in relation to those previously grown, for example, in my above-described arrangements) without inducing fractures or other imperfections in such crystals due to thermal stresses.

Somewhat more specifically, the invention provides an apparatus for producing monocrystals having a relatively large diameter (say 50 or 60 mm) by the Verneuil technique whereby a seed crystal is mounted on a movable crystal support member or on a previously axially grown crystal within a furnace body having a burner guiding flame gases and crystal growth material to impinge against the seed crystal so that the material melts and adheres to the seed crystal and forms a monocrystal which grows axially upwardly therefrom while the crystal support member is moved axially downwardly a distance corresponding to the amount of axial crystal growth so that substantially uniform growth conditions are maintained throughout the crystal growing process. A massive (in relation to crystals being grown) flame deflector unit is positioned within the furnace body in spaced registry from the burner and having a central through passage therein which radially surrounds and is spaced from the crystal support member. The flame deflector member has a mass relative to the monocrystalline being grown sufficient to form a heat reservoir for the grown monocrystal after burner shut-down thereby preventing thermal stresses and the like from forming within the grown crystal. The deflector unit is formed of a high heat capacity material and shaped to have a central through passage therein and upper outwardly beveled surfaces extending radially away from the central passage and facing the stream of flame gases within the furnace means so as to allow the hot gases to impinge onto the dome or growth front of the growing crystal, while deflecting such gases away from all other (lateral) surfaces of the growing crystal. The growing crystal and its support are positioned within the central through passage of the deflector unit and are axially movable relative thereto so that the growth front of the growing crystal continuously barely protrudes above the deflector unit, even as the crystal is growing axially upwardly. In accordance with the principles of the invention, the deflector unit is provided with at least one axially movable insert member within the central through passage of the deflector unit. The insert member is radially spaced from the crystal support member and the deflector unit and is selectively movable in relation to the deflector member and the crystal support member. In certain embodiments, a plurality of such insert members are concentrically positioned within the deflector unit, each radially spaced from the other insert members and the crystal support member and the deflector member and each of such insert members are selectively movable in relation to the other insert members and in relation to the deflector member and the crystal support member.

Figure 1:
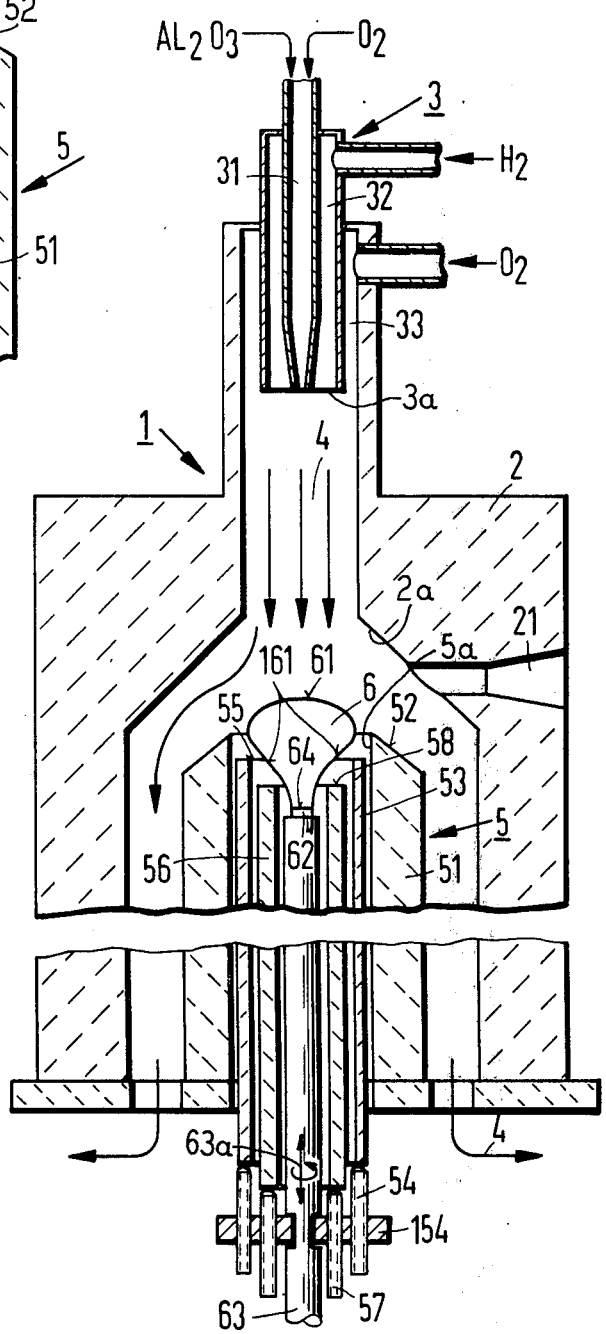
FIG. 1 is an essentially schematic cross-sectional view illustrating an exemplary embodiment constructed and operated in accordance with the principles of the invention.

The exemplary embodiment of the invention illustrated at FIGS. 1 and 2 (where like elements have identical reference numerals) comprises an apparatus 1 composed of a furnace means or body 2 having a burner 3 mounted at the upper portion of the body 2 and in communication with the inner chamber 2a thereof. As shown, the burner 3 includes flow passages for introducing flame gases such as $O_2$ and $H_2$ and a crystal-forming material, such as pulverized $Al_2O_3$ so as to produce a downwardly directed flame 4 which carries crystal forming material therein. In the exemplary embodiment, burner 3 is illustrated as a 3-tube burner having flow passages 31, 32 and 33 arrangement axially in relation to one another. The intermediate flow passage 32 carries a stream of $H_2$ while the outer and inner flow passages carry a stream of $O_2$. In addition, the inner flow passage carries an amount of a crystal-forming powder, such as $Al_2O_3$. As those in the art may appreciate, appropriate gas supply means, powder supply means, means for controlling the flow of the gas stream as well as the powder stream may be associated with this type of burner to provide an operational arrangement. For the sake of simplicity, all such associated means will be assumed to be operationally connected to a burner so that when reference is made herein and in the claims to a burner, it will be understood to include all means necessary to render the burner operational.

In the preferred embodiments, the total diameter of the burner is selected to be approximately equal to the diameter of the crystal to be grown.

In the illustrated embodiment, a gas deflector unit 5 is positioned within chamber 2a of furnace body 2. The top of unit 5 is positioned a select distance, for example, 200 mm, below the orifice 3a of burner 3 so that the flame gases 4 impinge downwardly onto the deflection unit 5 and are deflected laterally away therefrom as shown by the curved arrow. The deflector unit 5 includes a central through passage 5a which has an outer diameter somewhat larger than the cross-section of the monocrystal being grown. A crystal support member 63 is positioned within the through passage 5a and is provided with a seed crystal 62 at its upper end so that a crystal 6 can grow axially upwardly therefrom. In the illustration shown, the crystal 6 has grown an initial length, for example, 25 mm, upwards from the seed crystal. During this growth process, the crystal support member 63, which is axially and rotationally movable as schematically illustrated by arrows 63a, is slowly moved axially downwardly so that the dome or growth front 61 of crystal 6 is always maintained in a fixed position in relation to flame 4 or burner 3 so that substantially identical growth conditions are present at the growth front 61 during the entire growth process.

The flame deflector unit 5 is typically attached in a fixed position within chamber 2a so as to have a fixed relation to furnace body 2 and burner 3. This type of deflector unit is substantially similar to that disclosed by me in the hereinbefore referenced patent publications and comprises an outer deflector member 51 in the present invention. Outer deflector member 51 is positioned in an axially fixed manner in relation to furnace body 2 and burner 3, but for sake of simplicity, the support means for member 51 have not been shown in detail and any suitable support means may be used. The outer deflector member 51 is, as already disclosed by me, relatively massive and formed of a high heat capacity material, such as sintered $Al_2O_3$ or $ZrO_2$. In addition, the outer deflector member 51 is provided with upper outwardly beveled conical surface 52 which faces the flame 4. The hot flame 4 is laterally deflected by surface 52 and is thus guided away from the previously grown surface of crystal 6. As was implied hereinbefore, the illustration at FIG. 1 represents an early stage of crystal growth so that the full lateral surfaces of a finished crystal are not yet present. With an apparatus of the type shown, monocrystals may be grown, for example, which have a length 1 to 5 times the diameter (up to about 60 or more millimeters) of the monocrystal.

In accordance with the invention, an axially movable insert member 53 is positioned within the through passage 5a of deflector unit 5 and within the outer member 51 in a radially spaced relation to the crystal support member 63 and to the inner walls of member 51. Thus, the deflector unit 5 is comprised of a fixed outer member 51 and at least one axially movable insert member 53. An axially movable support means 54, which is schematically illustrated as a threaded screw member, is provided along the bottom of insert member 53 so as to selectively axially move member 53 in relation to member 51 and crystal support member 63.

FIG. 1 illustrates a further embodiment of the invention wherein a further or second insert member 56 is positioned within the through passage 5a of deflector unit 5 and concentrically with the insert member 53. Insert member 56 is axially movable relative to the insert member 53 as well as relative to the deflector member 51 and the crystal holder member 63. As shown, the members 51, 53 and 56 are mounted in a concentric relation to one another with members 53 and 56 being axially movable relative to member 51 and relative to each other. Insert member 56 is provided with an axially movable support member 57, again schematically illustrated as a threaded screw member operable in a conventional manner, although other axially movable support means could also be utilized.

During operation of an apparatus such as illustrated at FIG. 1 wherein only a seed crystal 62 is initially provided on the support member 63, the support member is axially moved so that only the upper surface of the seed crystal barely protrudes above the top of the deflector unit 5 and the axially movable insert members 53 and 56 are set into a position so that the upper end face 55 of the first insert member 53 and the upper end face 58 of the second insert member 56 are substantially level with the upper edge of the beveled face 52 of member 51. In a typical operation, the crystal support member 63 is moved upwardly so that the boundary face 64 between the seed crystal 62 and the to-be-grown crystal 6 is somewhat higher, say about 10 mm, than the upper edge of beveled face 52 and the burner is then ignited for commencement of crystal growth.

During increased growth of a crystal 6 on seed crystal 62, a deliberate and substantial increase in the cross-sectional diameter of crystal 6 occurs in relation to the cross-section diameter of boundary face 64. In the illustration, this widening is shown at reference numeral 161. This increase in cross-section is achieved by selectively controlling growth conditions for the crystal so that a portion of the crystal growing material which is supplied in powder form and melts within the flame, adhered onto the growth front 61 of the growing crystal, flows across the edge of the growth front to the side surface or face of the growing crystal and solidifies thereat. With a successive increase in the cross-section dimension of crystal 6, the position of the insert member 53 and 56 is changed. First, by means of movable support 57, the innermost insert member 56 is lowered a sufficeint amount to accommodate the increased cross-section of crystal 6. Thereafter, by means of movable support 54, the next radially outwardly insert member, i.e. 53 is likewise lowered a sufficient amount to accommodate the increased cross-section of the crystal. It is extremely important to adjust the position of insert members 53 and 56 during the crystal growth process in order to avoid fusing the upper edges thereof with the growing crystal. By proper adjustment of the insert member positions, the flame 4 is almost entirely deflected laterally away from the grown crystal surfaces and a very small amount, if any, of the flame gases penetrates into the throughpassage 5a of deflector unit 5, i.e. into the space between insert members 53 and 56 and the crystal support member 63.

The provision of the insert members 53 and 56 in an apparatus constructed in accordance with the principles of the invention allows the cross-section of the growing monocrystal to increase a desired extent from the cross-section of the seed crystal. The penetration of the flame gases into the interior of the deflector unit 5 could, at least to a certain extent, be prevented by sealing the lower end of the passage 5a within the deflector unit in a gas-impermeable manner. However, experiments actually carried out indicate that the desired increase in crystal cross-section could not be satisfactorily achieved by this means. However, surprisingly, by providing at least one insert member within the throughpassage 5a of a deflector unit, the desired increase in crystal cross-section can readily be achieved. This appears to be due to the fact that the upper portion of the insert members, which are closely adjacent to the lateral walls of the growing crystal, prevent or minimize cooling of the lateral or side walls of the growing crystal. It will be understood that such side wall is the crystal surface designated by reference numeral 161 and which expands similarly to a cone (when a sapphire crystal is being grown) or to a pyramid (when a spinel crystal is being grown). The particular shape is dependent upon the crystal structure and on the different growth rates of the individual crystal faces. If, on the other hand, an attempt was made to increase the cross-section of a growing crystal without the use of insert members and a seed crystal having a diameter corresponding to that of the crystal to be grown (for example 35 to 40 mm) were provided, failure would result since, as has been established, a too great of cooling of the crystal lateral surfaces takes place and an increase of the growing crystal cross-section to that of the large diameter seed crystal cannot be satisfactorily achieved.

Preferably, the insert members are composed of high melting flame resistant materials, such as aluminum or zirconium oxides. For satisfactory operation, it is advisable to maintain the heat transfer between the upper edges, such as 55 and 58, of the insert members and the remainder thereof as low as possible. This may be achieved by proper material selection and by maintaining the cross-section of the insert members as small as possible. This may require a large number of insert members in order to be able to properly bridge the overall difference in cross-sections between a relatively small diameter seed crystal and a relatively large diameter utilmately grown monocrystal.

The embodiment illustrated at FIG. 1 contains two insert members 53 and 56. However, depending upon the desired amount of cross-sectional increase from the seed crystal to the ultimate crystal grown, one may utilize a single insert member within the outer deflector member 51 or a plurality of insert members arranged similarly to the two insert members illustrated.

It is to be noted that generally seed crystals used in growing crystals have a relatively small cross-section (i.e. surface 64) and typically may have a cross-section ranging between $1 \times 1$ to $3 \times 3$ mm$^2$. Monocrystals grown on such seed crystals in an apparatus constructed in accordance with the principles of the invention, may have diameter of up to 60 mm and larger; even these extremely large monocrystals are uniform, crack-free bodies which do not exhibit any stresses that could become detrimentally manifested during subsequent mechanical processing of such bodies, for example in forming substrate discs or the like. For sake of comparison, crystals grown in apparatus as described in the hereinbefore referenced patents (i.e. without insert members) can only be produced with diameters up to about 35 mm.

In growing monocrystals with an extremely large cross-section, it is advisable to use a burner which has a flame cross-section at least equal to the cross-section of the utilmately grown monocrystal. As will be appreciated, various sized burners may be mounted on furnace bodies, depending upon the desired cross-section of the crystal being grown.

In a device constructed in accordance with the principles of the invention, the gas deflector unit 5 is provided with an outer deflector member 51 which has a sufficient mass in relation to the crystal being grown to maintain a heat equilibrium between the growing crystal and the deflector unit 5 during the growth process and after flame shut-down. For example, when a crystal having a 55 mm diameter is to be grown, an outer deflector member 51 is utilized which has an inner diameter of about 65 mm and an outer diameter of about 100 mm. Since the deflector member is composed of a high heat capacity material and is relatively massive, it absorbs heat from the gases and acts as a heat reservoir for the growing crystal. As will be appreciated, different crystals have different thermal characteristics and accordingly it is advisable to match the thermal capacity of the deflector member to the particular thermal characteristics of the particular crystal being grown. For example, when a spinel monocrystal such as a Mg-Al spinel or a mullite monocrystal such as $Al_2O_3 \cdot SiO_2$ or other relatively high melting crystals are being grown to the size indicated above, then an outer deflector member is utilized which has a large mass, i.e. has an outer diameter of about 130 mm. In other words, a deflector member with a suitable higher heat capacity is utilized. Exemplary material which are useful in forming the deflector members are aluminum oxide and zirconium oxide as well as other high melting fire-resistant materials.

When a seed crystal having a cross-section of about $3 \times 3$ mm$^2$ is used to grow monocrystals with the apparatus of the invention, it is advisable to utilize two insert members, such as 53 and 56 shown at FIG. 1. The outer and inner diameter of such insert members are, respectively, 40 and 49 mm and 51 and 63 mm. Such dimensioned insert members have sufficient free space between the individually movable members and the stationary outer member so that the insert members can freely move and yet prevent the flame gases from entering the interior of the deflector member 51. It should be noted that the insert members of the invention retain only a small amount of heat after flame shut-down and the thermal equilibrium is primarily between the crystal 6 and the deflector member 51. Further, at flame shut-down, the insert members are in their maximum lowered position (best seen at FIG. 2) and are thus not in close proximity to the crystal surfaces. However, at such a bottom position, the insert members do reduce heat radiation from the crystal in the downward direction.

In another embodiment of the invention, a simplified arrangement of movable support means 54 and 57 is provided. This construction is attained because, after the initial growth phase of the crystal 6 occurs, i.e, the phase during which a substantial widening of the growing crystal from the dimension of the seed crystal to the final diameter thereof occurs, the axial displacement of insert members 53 and 56 may take place uniformly, i.e. with the axial lowering of crystal holder or support member 63. Accordingly, the movable support means 54 and 57 are mechanically coupled with the support member 63 in such a manner that the insert members are each movable relative to member 63 and as a unit therewith. An embodiment of such a mechanical coupling is illustrated at FIG. 1 wherein the support means 54 and 57 are illustrated as screw members threaded through a plate 154 which is supported in a non-rotational manner by member 63. With this type of arrangement, during the initial growth phase, the individual insert members are lowered in relation to the widening of the monocrystal being grown and once the final diameter of such monocrystal has been achieved, crystal support 63 and insert members 53 and 56 are uniformly moved as a unit by the mechanical coupling provided by plate 154.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appendant claims.

I claim as my invention:

1. An apparatus for producing monocrystals having a relatively large cross-section by the Verneuil technique wherein a seed crystal is mounted on a movable crystal support member within a furnace means having a burner guiding flame gases and crystal growth material to impinge against said seed crystal so that said material melts and adheres to the seed crystal and forms a monocrystal which grows axially upwardly therefrom while the crystal support member is moved axially downwardly a distance corresponding to the amount of axial crystal growth so that substantially uniform growth conditions are maintained throughout the crystal growing process; the combination comprising:

a relatively massive flame deflector member positioned within the furnace means in spaced registry from the burner and having a central through passage therein which radially surrounds and is spaced from the crystal support member, said through passage having an outer diameter somewhat larger than the cross-section of the monocrystal being grown, said flame deflector member having a mass relative to the monocrystal being grown sufficient to form a heat reservoir for said monocrystal after burner shut-down, said flame deflector member having upper conical outwardly beveled surfaces extending radially away from said through passage therein for laterally deflecting flame gases impinging on the upper surface of the monocrystal being grown; and at least on axially movable insert member positioned within said through passage of the deflector member and radially spaced from the crystal support member and said deflector member, said insert member being selectively movable in relation to said deflector member and said crystal support member.

2. An apparatus as defined in claim 1 wherein said through passage is provided with a plurality of axially movable insert members, each of said insert members being radially spaced from the other insert members and from the crystal support member and the deflector member, each of said insert members being selectively movable in relation to the other insert members and in relation to the deflector member and to the crystal support member.

3. An apparatus as defined in claim 1 wherein said insert member is composed of a high melting fire-resistant material.

4. An apparatus as defined in claim 3 wherein said fire-resistant material is selected from the group consisting of aluminum oxide and zirconium oxide.

5. An apparatus as defined in claim 1 wherein a mechanical couple is provided between said crystal support member and said insert member so that said support member and said insert member are selectively movable as a unit.

* * * * *